United States Patent
Sato et al.

(10) Patent No.: US 10,672,615 B2
(45) Date of Patent: Jun. 2, 2020

(54) PLASMA PROCESSING APPARATUS AND PLASMA PROCESSING METHOD

(71) Applicant: TOSHIBA MEMORY CORPORATION, Tokyo (JP)

(72) Inventors: Yosuke Sato, Kanagawa (JP); Akio Ui, Tokyo (JP); Itsuko Sakai, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/440,043

(22) Filed: Feb. 23, 2017

(65) Prior Publication Data

US 2018/0012768 A1    Jan. 11, 2018

(30) Foreign Application Priority Data

Jul. 7, 2016    (JP) .................................. 2016-134884

(51) Int. Cl.
*H01L 21/00* (2006.01)
*C23C 16/00* (2006.01)
(Continued)

(52) U.S. Cl.
CPC ...... *H01L 21/3065* (2013.01); *H01J 37/3211* (2013.01); *H01J 37/3244* (2013.01); *H01J 37/32091* (2013.01); *H01J 37/32541* (2013.01); *H01L 21/67069* (2013.01); *H01J 2237/334* (2013.01)

(58) Field of Classification Search
CPC .............................................. H01J 37/32165
See application file for complete search history.

(56) References Cited

U.S. PATENT DOCUMENTS 4,349,409 A * 9/1982 Shibayama ....... H01J 37/32568
156/345.45
5,286,297 A * 2/1994 Moslehi .............. C23C 16/4405
118/723 E
(Continued)

FOREIGN PATENT DOCUMENTS

JP    2000-208090    7/2000
JP    2001-508923    7/2001
(Continued)

OTHER PUBLICATIONS

Notification of Reason for Refusal issued by the KIPO on Jan. 31, 2018, for Korean Patent Application No. 10-2017-0016949, and English-language translation thereof.

*Primary Examiner* — Sylvia MacArthur
*Assistant Examiner* — Michelle Crowell
(74) *Attorney, Agent, or Firm* — Finnegan, Henderson, Farabow, Garrett & Dunner, L.L.P.

(57) ABSTRACT

A plasma processing, apparatus of an embodiment includes a chamber, an introducing part, a first power source, a holder, an electrode, and a second power source. The introducing part introduces gas into the chamber. The first power source outputs a first voltage for generating ions from the gas. The holder holds a substrate. The electrode is opposite to the ions across the substrate, and has a surface not parallel to the substrate. The second power source applies a second voltage to the electrode. The second voltage has a frequency lower than the frequency of the first voltage and Introduces die ions to the substrate.

15 Claims, 11 Drawing Sheets

(51) Int. Cl.
  *H01L 21/3065* (2006.01)
  *H01J 37/32* (2006.01)
  *H01L 21/67* (2006.01)

(56) References Cited

U.S. PATENT DOCUMENTS

| | | | | |
|---|---|---|---|---|
| 5,711,814 | A * | 1/1998 | Mori | C23C 16/503 |
| | | | | 118/723 E |
| 5,882,424 | A * | 3/1999 | Taylor | B08B 7/0035 |
| | | | | 134/1 |
| 5,981,899 | A | 11/1999 | Perrin et al. | |
| 6,279,504 | B1 * | 8/2001 | Takaki | C23C 16/509 |
| | | | | 118/723 E |
| 2005/0130620 | A1 * | 6/2005 | Fischer | H01J 37/32082 |
| | | | | 455/333 |
| 2005/0199343 | A1 | 9/2005 | Ohkuni | |
| 2007/0074815 | A1 | 4/2007 | Ohkuni | |
| 2008/0119049 | A1 * | 5/2008 | Sung | H01J 37/32091 |
| | | | | 438/689 |
| 2008/0180357 | A1 | 7/2008 | Kawakami et al. | |
| 2008/0314318 | A1 * | 12/2008 | Han | H01J 37/32091 |
| | | | | 118/723 R |
| 2014/0083977 | A1 * | 3/2014 | Ui | H01J 37/32091 |
| | | | | 216/67 |
| 2014/0217881 | A1 * | 8/2014 | Nam | C23C 16/509 |
| | | | | 313/231.31 |
| 2015/0162223 | A1 * | 6/2015 | Ui | H01J 37/32009 |
| | | | | 438/10 |
| 2015/0279689 | A1 * | 10/2015 | Yamamoto | H01L 21/31144 |
| | | | | 438/713 |
| 2016/0027619 | A1 | 1/2016 | Sato et al. | |
| 2017/0186589 | A1 | 6/2017 | Sato et al. | |

FOREIGN PATENT DOCUMENTS

| | | |
|---|---|---|
| JP | 3816081 | 8/2006 |
| JP | 2008027816 A * | 2/2008 |
| JP | 2008-168387 | 7/2008 |
| JP | 2008-182081 | 8/2008 |
| JP | 2010-10417 | 1/2010 |
| JP | 2010-97776 | 4/2010 |
| JP | 2010-97776 A | 4/2010 |
| KR | 10-2016-0011564 A1 | 2/2016 |

\* cited by examiner

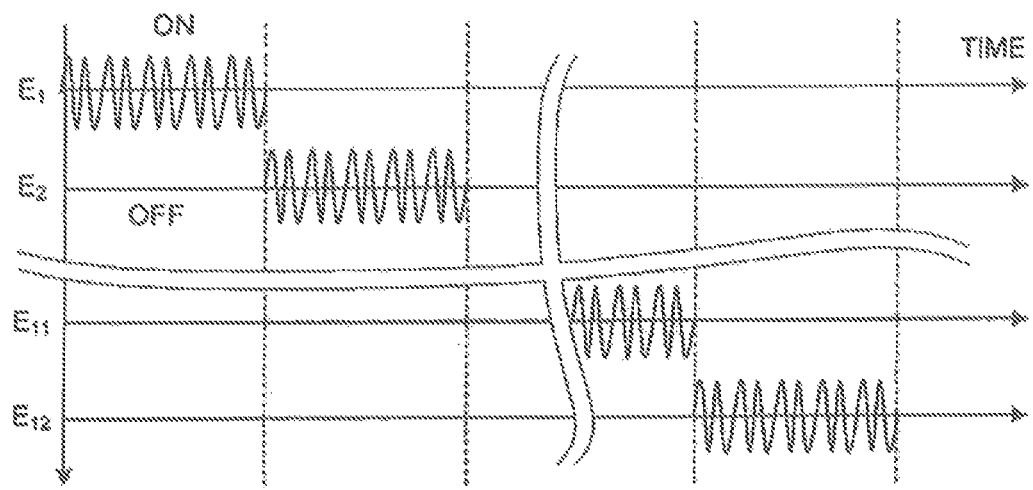
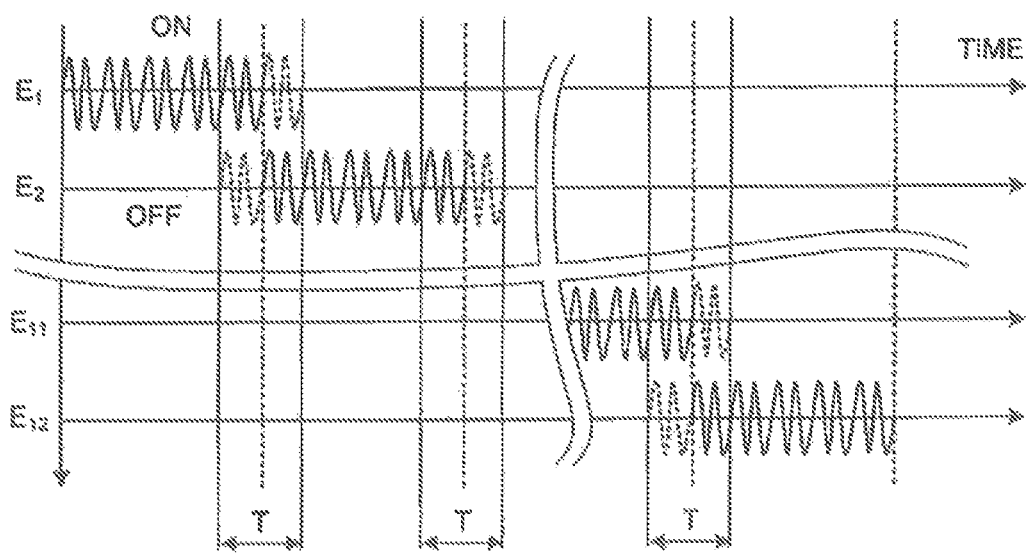

PLASMA PROCESSING APPARATUS AND PLASMA PROCESSING METHOD

CROSS REFERENCE TO RELATED APPLICATION

This application is based upon and claims the benefit of priority from Japanese Patent Application No. 2016-134884, filed on Jul. 7, 2016; the entire contents of which are incorporated herein by reference.

FIELD

Embodiments described herein relate generally to a plasma processing apparatus and a plasma processing method.

BACKGROUND

A plasma processing apparatus generates plasma, and makes ions in the plasma to be incident on a substrate (semiconductor wafer, for example), to thereby process the substrate, in a process of manufacturing a semiconductor device, when incident ions perform etching on a substrate, a trench, a via hole, a projecting portion and the like are formed.

Here, in the process of manufacturing the semiconductor device, it is important to perform fine control of processing shape, particularly vertical processing of a sidewall of trench for securing electrical performance of the semiconductor device. For example, a device with three-dimensional structure in recent years has a deep hole with large aspect ratio.

However, it is not always easy to perform the fine control of processing shape. For example, it is usually the case that the sidewall of trench is not vertically formed, and is tapered.

BRIEF DESCRIPTION OF THE DRAWINGS

FIG. 10 is a timing chart illustrating one example of voltage waveforms applied to the introduction electrodes 31.

FIG. 11 is a timing chart illustrating one example of voltage waveforms applied to the introduction electrodes 31.

DETAILED DESCRIPTION

In one embodiment, a plasma processing apparatus includes a chamber, an introducing part a first power source, a holder, an electrode, and a second power source. The introducing part introduces gas into the chamber. The first power source outputs a first voltage for generating ions from the gas. The holder holds a substrate. The electrode is opposite to the ions across the substrate, and has a surface not parallel to the substrate. The second power source applies a second voltage to the electrode. The second voltage has a frequency lower than the frequency of fee first voltage and introduces the ions to the substrate.

Hereinafter, embodiments will be described in detail with reference to the drawings.

COMPARATIVE EXAMPLE

First, in order to describe embodiments of the present invention, a general plasma processing apparatus will be described as a comparative example.

Figure 1:
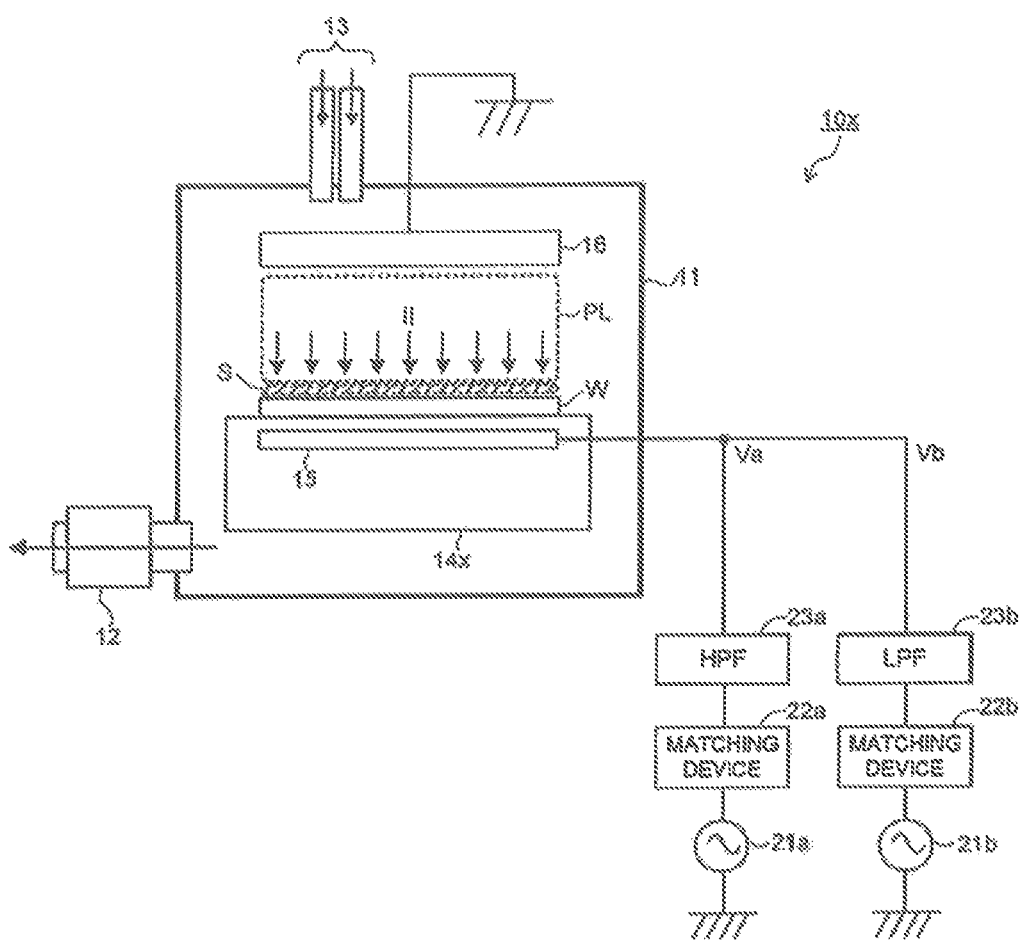
FIG. 1 is a schematic configuration diagram of a plasma processing apparatus 10x according to a comparative example.

FIG. 1 is a schematic configuration diagram of a plasma processing apparatus 10x according to a comparative example. The plasma processing apparatus 10x is a parallel plate type RIE (Reactive Ion Etching) apparatus, and has a chamber 11, an exhaust port 12, a process gas introduction pipe 13, a susceptor 14x, a substrate electrode 15, a counter electrode 16, an RF high-frequency power source 21a, an RF low-frequency power source 21b, matching devices 22a and 22b, and filters 23a and 23b.

An RF high-frequency voltage Va and an RF low-frequency voltage Vb from the RF high-frequency power source 21a and the RF low-frequency power source 21b, respectively, are superposed to be applied to the substrate electrode 15, thereby realizing generation of plasma PL and introduction of ions II.

The chamber 11 maintains an environment required to perform processing on a wafer W.

The exhaust port 12 is connected to not-illustrated pressure regulating valve and exhaust pump. Gas in the chamber 11 is exhausted from the exhaust port 12, resulting in that the inside of the chamber 11 is maintained in a high-vacuum state. Further, when process gas is introduced from the process gas introduction pipe 13, a flow rate of gas flowed in through the process gas introduction pipe 13 and a flow rate of gas flowed out through the exhaust port 12 are balanced, resulting in that a pressure in the chamber 11 is kept constant.

The process gas introduction pipe 13 is an introducing part which introduces process gas required to perform processing on the wafer W, into the chamber 11. The process gas is used for forming plasma PL. By an electric discharge, the process gas is ionized to be turned into plasma PL, and ions II in the plasma PL are used for performing etching on the wafer W.

As the process gas, it is possible to appropriately use $SF_6$, $CF_4$, $C_2F_6$, $C_4F_8$, $C_5F_8$, $C_4F_6$, $Cl_2$, HBr, $SiH_4$, $SiF_4$ or the like, other than gas of Ar, Kr, Xe, $N_2O_2$, CO, $H_2$ or the like.

Here, the process gas can be classified into deposition-type gas and depositionless-type gas. The depositionless-type gas is gas that performs only an etching operation when performing processing on the wafer W. On the other hand, the deposition-type gas performs not only the etching operation but also an operation of forming a coating film (protective film) when performing processing on the wafer W.

By using the deposition-type gas as the process gas, it is possible to improve a selection ratio of etching between an etching mask and an etching target (the wafer W or the like). Specifically, when the depositon-type gas is used, the etching proceeds during which a coating film is formed on the etching mask. As a result of this, an etching rate of the etching mask is reduced, and the selection ratio can be improved.

The classification of deposition type and depositionless type is not always an absolute one. Rare gas (Ar, Kr, Xe) does not perform the operation of forming the coating film almost at all, and thus it can be considered as pure depositionless-type gas, but, the other gas cars perform the operation of forming the coating film in any way. Further, a magnitude relation between the etching operation and the operation of forming the coating film can be changed, based on a relation of a material and a shape of the etching mask and the etching target, a process pressure and the like.

Generally, Ar, Kr, Xe, $H_2$ and the like can be cited as the depositionless-type gas. Further, $C_2F_6$, $C_4F_6$, $C_4F_8$, $C_5F_8$, $SF_6$, $Cl_2$, HBr and the like can be cited as the deposition-type gas. As an intermediate kind of gas between the deposition-type gas and the depositionless-type gas, there can be cited $N_2$, $O_2$, CO, and $CF_4$.

In a general plasma processing apparatus including this apparatus 10x in the comparative example, the substrate electrode 15 has a flat plate shape. Accordingly, in the plasma processing apparatus 10x, ions II are vertically incident on a plane of the wafer W from the plasma PL, When the ions II are vertically incident on the wafer W, the ions II do not hit against a sidewall of trench on the wafer W, resulting in that a residue is easily generated on the sidewall. In the embodiments of the present invention, an apparatus configuration and a method of controlling an incident angle of ions, are proposed as one of methods for improving this point.

First Embodiment

Figure 2:
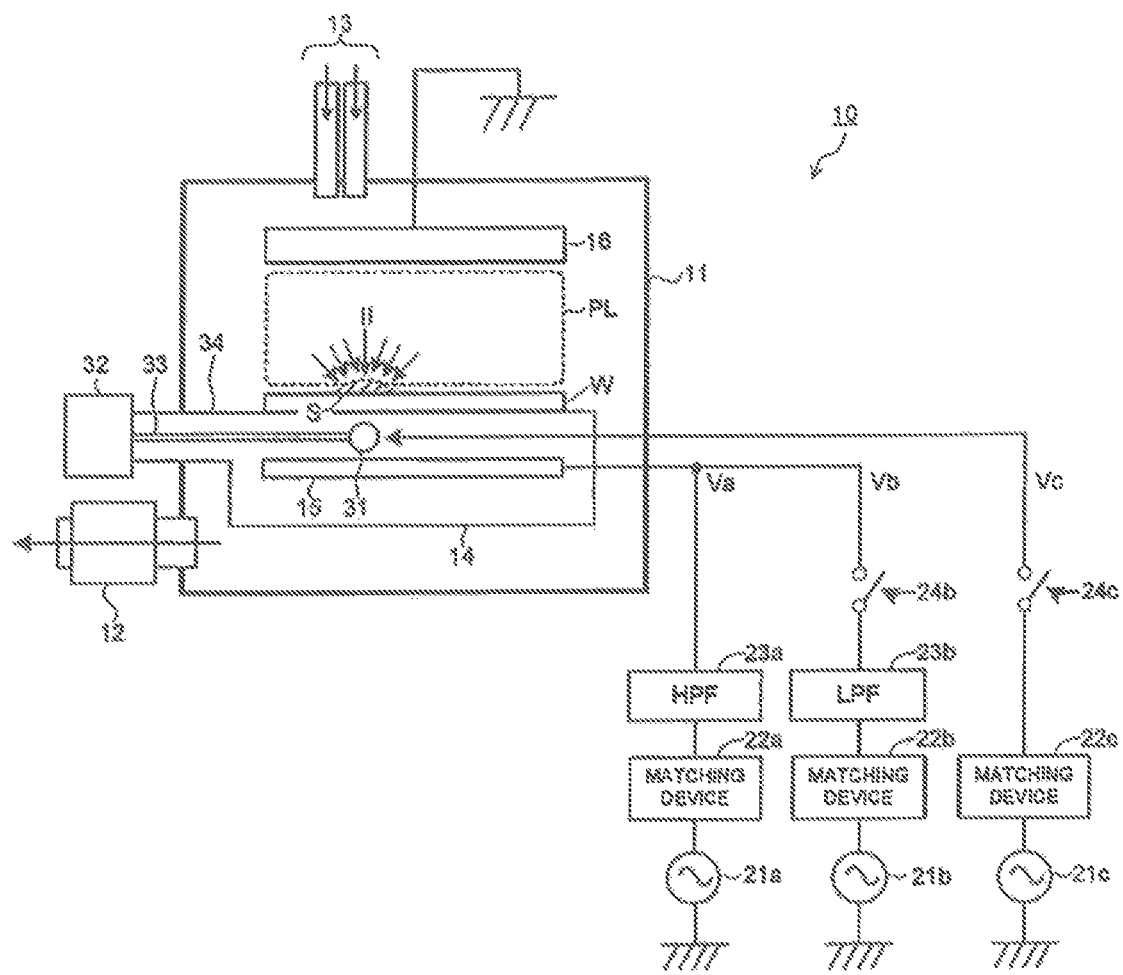
FIG. 2 is a schematic configuration diagram of a plasma processing apparatus 10 according to a first embodiment.

A first embodiment will be described. FIG. 2 is a schematic configuration diagram of a plasma processing apparatus 10 according to the first embodiment.

In a similar manner to the general plasma processing apparatus, the plasma processing apparatus 10 makes ions II in plasma PL to be incident on a wafer W to perform etching on the wafer W, thereby forming a trench, a via hole, a projecting portion and the like. The wafer W is a substrate, which is, for example, a substrate of semiconductor (Si, GaAs or the like).

The plasma processing apparatus 10 has a chamber 11, an exhaust port 12, a process gas introduction pipe 13, a susceptor 14, a substrate electrode 15, a counter electrode 16, an RF high-frequency power source 21a, RF low-frequency power sources 21b and 21c, matching devices 22a to 22c, filters 23a and 23b, switches 24b and 24c, an introduction electrode 31, a moving mechanism 32, a connection part 33, and a retreat part 34.

The susceptor 14 is a holder holding the wafer W, and has a chuck for holding the wafer W. As the chock, a mechanical chuck which dynamically holds the wafer W, or an electrostatic chuck that holds the wafer W with the use of an electrostatic force can be used.

The susceptor 14 may also have a rotating mechanism which rotates the wafer W. Although a reason thereof will be described later, by rotating the wafer W relative to the introduction electrode 31 to make a direction of trench of the wafer W and a direction of the introduction electrode 31 coincide with each other or have an angle therebetween, it becomes possible to perform efficient processing.

The substrate electrode 15 is an approximately flat plate-shaped (disk-shaped) electrode disposed in the susceptor 14 and having an upper surface which is close to or brought into contact with a lower surface of the wafer W. Specifically, the wafer W (substrate) is placed on the substrate electrode 15 indirectly (the both are close to each other) or directly (the both are brought into contact with each other).

The counter electrode 16 is disposed to face the substrate electrode 15 in the chamber 11, and is set to a ground potential. The counter electrode 16 and the substrate electrode 15 form a parallel plate electrode.

The RF high-frequency power source 21a generates an RF high-frequency voltage Va which is applied to the substrate electrode 15. The RF high-frequency power source 21a corresponds to a first high-frequency power source which outputs a first high-frequency voltage (RF high-frequency voltage Va) for ionizing process gas to generate plasma.

The RF high-frequency voltage Va is an alternating voltage of relatively high frequency which is used for generating plasma PL. A frequency fh of the RF high-frequency voltage Va is not less than 40 MHz nor more than 1000 MHz, and is more preferably not less than 40 MHz nor more than 500 MHz (100 MHz, for example).

The RF low-frequency power sources 21b and 21c respectively generate RF low-frequency voltages Vb and Vc which are applied to the substrate electrode 15 and the introduction electrode 31, respectively. The RF low-frequency power source 21c corresponds to a second high-frequency power source which applies a second high-frequency voltage (RF low-frequency voltage Vc) having a frequency lower than the frequency of the first high-frequency voltage and used for introducing ions irons plasma, to the introduction electrode.

The RF low-frequency voltages Vb and Vc are alternating voltages of relatively low frequencies, which are used for introducing ions II from plasma PL. A frequency fl of the RF low-frequency voltage Vb is not less than 0.1 MHz nor more than 20 MHz, and is more preferably not less than 0.5 MHz nor more than 14 MHz (1 MHz, for example). Here, each of Va, Vb, and Vc is generally referred to as a high-frequency voltage, but, Vb and Vc are referred to as RF low-frequency voltages for the sake of convenience, in order to describe a difference of the respective frequencies.

The matching devices 22a to 22c respectively match the impedance of the RF high-frequency power source 21a and the RF low-frequency power sources 21b and 21c to that of the plasma PL and the like.

The filter 23a (HPF: High Pass Filter) prevents the RF low-frequency voltage Vb from the RF low-frequency power source 21b from being input into the RF high-frequency power source 21a. The filter 23b (LPF: Low Pass Filter) prevents the RF high-frequency voltage Va from the RF high-frequency power source 21a from being input into the RF low-frequency power source 21b. Another power source is not connected to the RF low-frequency power source 21c, so that there is no need to connect a filter to the RF low-frequency power source 21c. However, it is also possible to add the filter to the RF low-frequency power source 21c from a viewpoint of safety.

The switches 24b and 24c switch the vertical incidence and the oblique incidence of ions II, in accordance with a process condition. When performing the vertical incidence of ions II, the switch 24b is turned on and the switch 24c is turned off, to thereby apply the low-frequency voltage only to the substrate electrode 15. When performing the oblique Incidence of ions II, the switch 24b is turned off and the switch 24c is turned on, to thereby apply the low-frequency voltage only to the introduction electrode 31. Specifically, the switches 24b and 24c to select either of the substrate electrode 15 and the introduction electrode 31, and applying the RF high-frequency voltage Vb or Vc (second high-frequency voltage) to the selected electrode.

The introduction electrode 31 is disposed between the wafer W and the substrate electrode 15, and has a surface which is not parallel to the wafer W. Accordingly, it becomes possible to make the ions II to be obliquely incident on the wafer W. The introduction electrode 31 functions as an electrode disposed to face ions (plasma PL) with the substrate (wafer W, for example) sandwiched therebetween, and having a surface which is not parallel to the substrate.

Hereinafter, description will be made on how to decide an incident direction of the ions II on the wafer W, including a principle of plasma etching. At a boundary between the plasma PL and the wafer W, there is formed a region called sheath S. Although an electric field in the plasma PL is substantially zero, an electric field in the sheath S is large. This is because a thickness of the sheath S is smaller than that of the plasma PL, and a large part of the voltages from the RF high-frequency power source 21a and the RF low-frequency power sources 21b and 21c is applied to the sheath S. By this electric field, the ions II are accelerated to be incident on the wafer W. Therefore, by controlling a direction of this electric field, namely, a sheath shape, it is possible to control the incident angle of the ions II with respect to the wafer W.

In the comparative example, a sheath S along the substrate electrode 15 with a planar shape is formed (refer to FIG. 1). An electric field in the sheath S is vertical to a boundary of the sheath S (vertical to the substrate electrode 15). As a result of this, the ions II are vertically incident on the wafer W.

On the contrary, in the present embodiment, the introduction electrode 31 has the surface which Is not parallel to the wafer W, so that the sheath S has a shape along this surface, at the boundary with the plasma PL (an electric field in an oblique direction is generated), resulting in that the ions II are substantially vertically incident on this surface (the ions II are obliquely incident on the wafer W).

The surface which is not parallel to the wafer W, has a curved surface shape and faces a lower surface of the water W. The surface which is not parallel to the wafer W may also be a flat surface inclined with respect to the plane of the wafer W. This inclination is preferably large in some degree (5° or larger, for example). Further, by appropriately combining these curved surface and flat surface, a surface which is not parallel to the wafer W cars be configured. As described above, the introduction electrode 31 is only required to have a surface which is not parallel to a main surface of the wafer W, on the side of the wafer W.

Concretely, the introduction electrode 31 can be designed to have a bar shape (columnar shape, as one example), for example. At this time, a width (diameter) of the introduction electrode 31 is preferably about 0.5 to 7 mm, and is more preferably about 2 mm to 5 mm. This corresponds to a normal thickness of the sheath S of about 0.5 mm to 7 mm. In order to exert influence on the shape of the sheath S, a size of the introduction electrode 31 is preferably about the same as a thickness of the sheath S. Further, a length of the introduction electrode 31 is preferably larger than a diameter of the wafer W. This makes it easy to perform oblique incidence of ions on the entire area of the wafer W.

The introduction electrode 31 may also include, in a part thereof, a plane parallel to the wafer W. Although the plane itself does not substantially contribute to the generation of electric field of oblique components, it can help the introduction of ions II. For example, a part of the introduction electrode 31 is set to have a flat plate shape, and is disposed with respect to a region with low process rate within the plane of the wafer W, which can be utilized for correction of process.

A shape of the introduction electrode 31 is not limited to the columnar shape, and cars be set to a semicylindrical shape, a triangular prism shape, or a rectangular prism shape. If the electrode is set to have a semicylindrical shape, it is preferable to make a spherical surface thereof face the wafer W, from a viewpoint of facilitating the oblique incidence. If the electrode is set to have a rectangular prism shape, when an tipper surface thereof is parallel to the wafer W, the upper surface itself does not contribute to the generation of oblique electric field in reality, but, a side surface portion contributes to the generation of oblique electric field.

The introduction electrode 31 may also be set to have a circular shape (a spherical shape, a semi spherical shape, or a shape of short column having an axis substantially perpendicular to the wafer W) when seen from above (or below) the wafer W. In this case, an electrical field of oblique components in a 360-degree direction is generated, when seen from above the wafer W. If the electrode is set to have a semispherical shape, it is preferable to make a spherical surface thereof face the wafer W, from a viewpoint of facilitating the generation of oblique electric field.

If the electrode is set to have a shape of short column, when an upper surface thereof is parallel to the wafer W, the upper surface itself does not contribute to the generation of oblique electric field in reality, but, a side surface portion contributes to the generation of oblique electric field.

Figure 3:
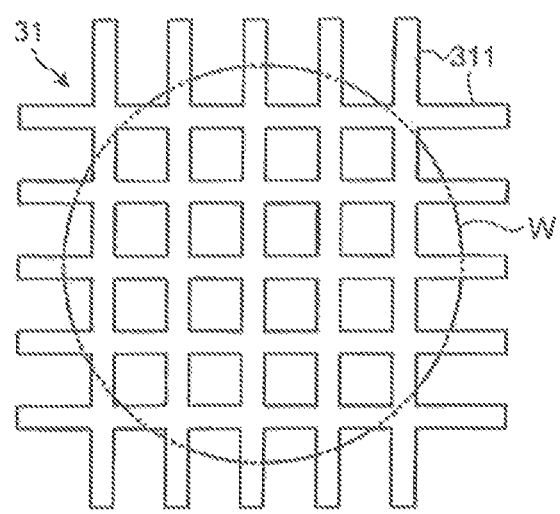
FIG. 3 is a fop view illustrating one example of an introduction electrode 31.

The shape of the introduction electrode 31 may also be set to a two-dimensional lattice shape, FIG. 3 is a top view illustrating one example of the introduction electrode 31 in the two-dimensional lattice shape, FIG. 3 illustrates a state where the electrode is seen from below the wafer W. Bar-shaped (for example, columnar-shaped) conductive members 311 in horizontal and vertical directions are integrally formed to obtain the introduction electrode 31. By appropriately selecting the shape and fee size of the introduction electrode 31, the incident angle and the range of oblique incidence of ions II can be changed.

The moving mechanism 32 is, for example, a motor or a movable stage, and moves the introduction electrode 31 along the main surface of the wafer W, to thereby uniformize the distribution of incidence of ions II on the wafer W. It is difficult to generate the oblique electric field in the entire region of the introduction electrode 31. For example, at a position right above a center of the introduction electrode 31 in a circular bar shape, because of symmetry thereof, the sheath S and the wafer W become parallel to each other. Specifically, ions are vertically incident at a position right above the introduction electrode 31, and a singular point is generated (refer to FIG. 2). In the processing of the wafer W (etching, for example), in-plane uniformity is important, and the existence of singular point is not preferable. In order to eliminate the singular point, in the present embodiment, the introduction electrode 31 is moved by the moving mechanism 32.

Concretely, the moving mechanism 32 makes the introduction electrode 31 move in parallel to and along the wafer W, so that a predetermined interval is kept between the introduction electrode 31 and the wafer W. For example, a bar-shaped introduction electrode 31 having a length larger than a diameter of the wafer W, is moved from one edge to the other edge of the wafer W. When the introduction electrode 31 is moved along the wafer W, the sheath S, and furthermore, the singular point (a point right above the introduction electrode 31, and at which the electric field of oblique components is not generated), move by following the electrode, resulting in that the singular point passes through the entire surface of the wafer W. As a result of this, the processing on the wafer W is uniformized.

An influence of a transition state of the shape of the sheath S when the introduction electrode 31 is mechanically moved, can be practically ignored. This is because the shape of the sheath S is formed in an extremely short period of time (0.01 µs or less) being about the same as the frequency of the RF low-frequency voltage Vc. Specifically, there is no practical need to pay attention, in particular, to a moving speed of the introduction electrode 31. When, for example, the electrode is moved from one edge to the other edge of the wafer W of 300 mm at a moving time of 10 seconds, this moving speed becomes about 300 mm/10 s=30 mm/s. When the moving time is 30 seconds, the moving speed becomes about 300 mm/30 s=10 mm/s. The moving speed may be faster or slower than the above speed of 10 to 30 mm/s. However, influence is exerted at the time of moving the electrode at a very high speed of MHz order, so that attentions have to be paid in that case.

A continuation time of the movement is appropriately changed depending on a process. Specifically, the application of voltage to the introduction electrode 31 and the movement of the introduction electrode 31 are continued in accordance with a period of time during which the electric field of oblique components is desired to be applied.

The way of moving the introduction electrode 31 is appropriately changed depending on a process. For example, the electrode may be moved at a stroke from one edge to the other edge of the wafer W (linear motion). Further, the electrode may also be repeatedly moved periodically (reciprocating motion). Furthermore, the electrode may also be appropriately stopped and moved again in a repeated manner. As long as an electrode center (singular point) passes through all positions within the plane of the wafer W by equal number of times or equal periods of time, the singular point is eliminated even if any method of moving is applied.

The moving mechanism 32 may also move the introduction electrode 31 in up and down directions. By changing a distance between the introduction electrode 31 and the wafer W, the incident angle and the distribution of ions II can be adjusted.

Figure 4:
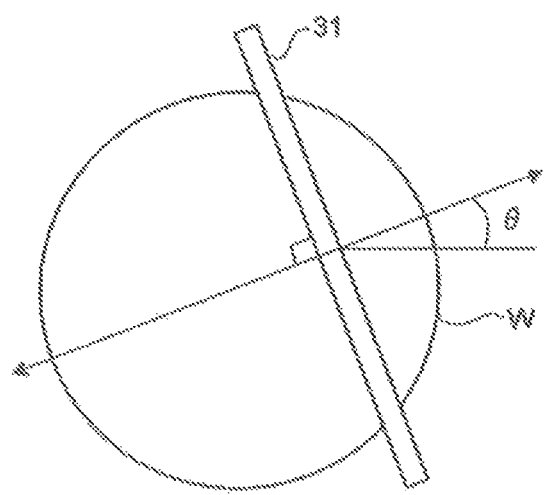
FIG. 4 is a schematic diagram illustrating a state where a direction and a moving direction of the introduction electrode 31 are changed by an angle θ relative to a wafer W.

Here, it is also possible that a direction and a moving direction of the introduction electrode 31 are changed relative to the wafer W, FIG. 4 is a schematic diagram illustrating a state where the direction and the moving direction of the introduction electrode 31 are changed by an angle θ with respect to the wafer W. FIG. 4 illustrates a state where the electrode is seen from below the wafer W, The rotation by this angle θ can be realized through, based on rotation of the introduction electrode 31 made by the moving mechanism 32, either rotation of the water W on the susceptor 14 (rotation made by the rotating mechanism of the susceptor 14 described above) or rotation of both of the electrode and the wafer.

The relative rotation between the Introduction electrode 31 and the wafer W is effective when forming a trench in one axial direction on the wafer W, for example. Specifically, by making a direction of this trench and the direction of the introduction electrode 31 coincide with each other, it is possible to efficiently irradiate ions II on facing sidewalk of the trench.

Further, by changing the angle θ and making the introduction electrode 31 make substantially a half turn, it is possible to further improve uniformization of the processing on the wafer W. For example, the introduction electrode 31 is made to perform reciprocating movement (sweep) on the wafer W at an angle θ=0°, and thereafter, the introduction electrode 31 is swept at respective angles θ of the angle θ=15°, 30°, up to the angle θ=165°, in increments of 15°. By designing as above, it is possible to secure the uniformization of the processing in the 360° direction. Such a movement is effective for forming a hole which requires oblique components from all directions.

Here, the range of change of the angle θ is set to correspond to substantially a half turn, but, an appropriate value such as substantially one turn can also be adopted. Further, the increment width of the angle θ can adopt an appropriate value such as 1°, other than 15°. Here, it is set that the angle θ is changed and then the electrode is swept, in which the angle θ is set to be constant during the sweep, but, it is also possible to set that the change of the angle θ and the sweep are simultaneously conducted, to thereby move the introduction electrode 31 while rotating the electrode relative to the wafer W.

The connection part 33 is a bar-shaped member (a rod or a shaft, for example) which connects the introduction electrode 31 and the moving mechanism 32.

Figure 5:
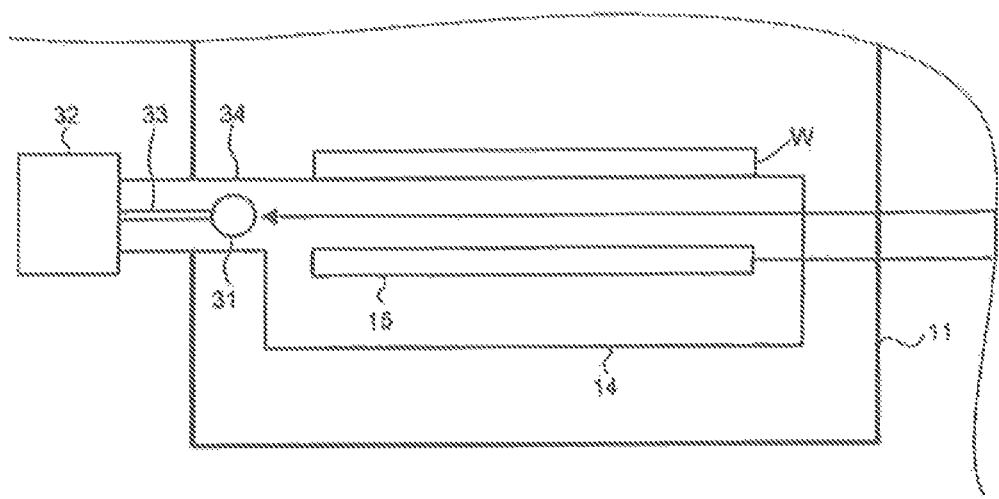
FIG. 5 is a schematic diagram illustrating a state where the introduction electrode 31 is moved to the inside of a retreat part 34.

It is also possible to provide the retreat part 34 for the introduction electrode 31. This retreat past 34 is a region disposed at a place separated from a place below the wafer W, and used for retreating the introduction electrode 31. When the ions II are vertically incident on the wafer W, there is no need to use the introduction electrode 31, so that the introduction electrode 31 is moved to the inside of the retreat part 34 (refer to FIG. 5).

Figure 6:
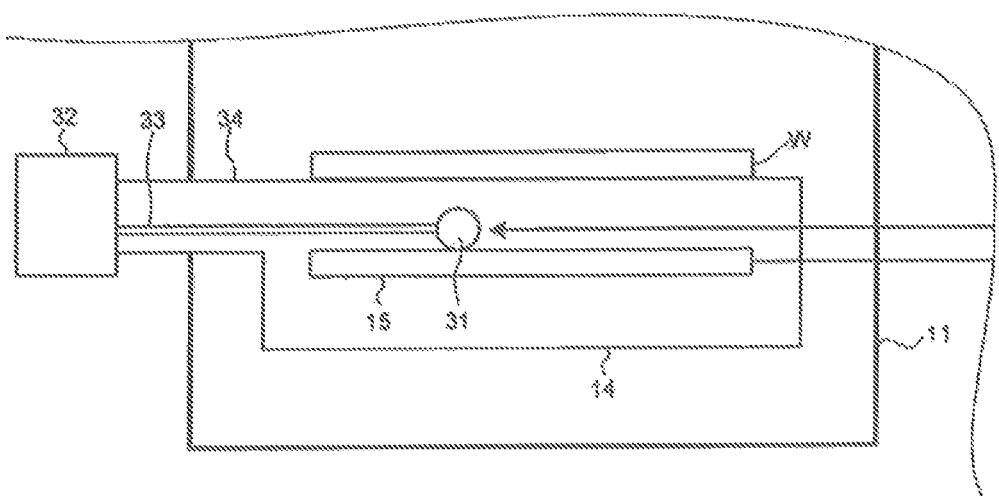
FIG. 6 is a schematic diagram illustrating a state where the introduction electrode 31 is brought into contact with a substrate electrode 15.

It is also possible that, instead of moving the electrode into the retreat part 34, the introduction electrode 31 is moved downward and brought into contact with the substrate electrode 15, so that the electrodes have the same potential (refer to FIG. 6). Specifically, the introduction electrode 31 is appropriately brought into contact with or separated from the substrate electrode 15 by the moving mechanism 32.

Further, the introduction electrode 31 may also be attachable/detachable to/from die plasma processing apparatus 10. The plasma processing apparatus 10 from which the introduction electrode 31 is detached, makes the ions II to be vertically incident on the wafer W, similarly to the ordinary apparatus.

Difference from Ion Beam Apparatus

Here, reference will be made to a point that a plasma processing apparatus and an ion beam apparatus have greatly different purposes of use and apparatus configurations. The plasma processing apparatus according to the present embodiment performs control of the angle of ions II by controlling the sheath S peculiar to the plasma processing apparatus. On the other hand, as an apparatus which performs processing on a substrate such as a wafer W using plasma in the same manner, there is an ion beam apparatus. Also in this ion beam apparatus, control of an incident angle of ions is important, and, for example, there is proposed a method of controlling an exit angle of ion beams.

The largest difference is a distance between plasma and a substrate. As described above, in the plasma processing apparatus 10, the plasma and the substrate being an object to be processed (wafer W) are brought into contact with each other, and thus the processing is directly performed. On the other hand, in the ion beam apparatus, a position at which the plasma is generated is separated from the wafer. Accordingly, in the ion beam apparatus, by independently controlling the exit angle and the angle of the substrate, it is possible to control the angle of ions II with respect to the substrate. On the contrary, in the plasma processing apparatus 10, the plasma is in contact with the wafer, and thus when controlling the angle of ions, there is a need to exert influence also to the plasma at the same time.

Difference from Conventional Plasma Processing Apparatus

Further, reference will be made to a difference from a conventional plasma processing apparatus. In the conventional plasma processing apparatus, an electrode is sometimes added or divided. For example, an electrode is sometimes added to an edge of a chamber, and a substrate electrode is sometimes divided. However, these addition and division of electrodes are basically performed for improving the uniformization of the process, and thus are greatly different from the addition of the introduction electrode 31 of the present embodiment realizing the generation of local electric field distribution, regarding the purpose, the position at which the electrode is added, and the like.

Operation of Plasma Processing Apparatus 10

In the chamber 11 in which an evacuation is conducted and a pressure reaches a predetermined pressure (0.01 Pa or less, for example), the wafer W is carried by a not-illustrated carrying mechanism. Next, the wafer W is held by the susceptor 14 with the use of the chuck. At this time, the substrate electrode 15 is close to or brought into contact with the wafer W.

Next, the process gas required to perform the processing on the wafer W is introduced from the process gas introduction pipe 13. At this time, the process gas introduced into the chamber 11 is exhausted at a predetermined rate from the exhaust port 12 by the not-illustrated pressure regulating valve and exhaust pump. As a result of this, the pressure in the chamber 11 is kept constant (about 1.0 to 6.0 Pa, for example).

Next, the RF high-frequency voltage Va from the RF high-frequency power source 21a is applied to the substrate electrode 15. Further, the RF low-frequency voltage Vc is applied from the RF low-frequency power source 21c to the introduction electrode 31.

A density of the plasma PL is controlled by the RF high-frequency voltage Va from the RF high-frequency power source 21a. The ions II in the plasma PL are introduced into the introduction electrode 31 (wafer W) by the RF low-frequency voltage Vc from the RF low-frequency power source 21c. Further, the wafer W is etched by the ions II having an energy with a value which is equal to or greater than a threshold value in the etching processing of the wafer W. At this time, in accordance with the shape of the introduction electrode 31, the electric field in the oblique direction with respect to the plane of the wafer W (oblique electric field) is generated.

In the present embodiment, the ions II can be obliquely incident on the wafer W. By using the obliquely incident ions II, it becomes possible to perform processing with high precision when forming the trench or the projecting portion, while reducing the taper.

For example, when forming the trench or the projecting portion in one axial direction, the amount of ions II which are incident on a sidewall of the trench or the like is increased, resulting in that the taper can be reduced. In this case, it is preferable to make a direction of the trench or the projecting portion (direction of processing line on the wafer W) and the direction of the introduction electrode 31 coincide with each other. By making the Ions II to be obliquely incident from both sides of the trench or the projecting portion, it is possible to reduce the taper on both sidewalls.

In parallel with the application of the RF low-frequency voltage Vc to the introduction electrode 31, the introduction electrode 31 is moved by the moving mechanism 32, thereby realizing uniformization of the processing on the wafer W. The introduction electrode 31 may perform reciprocating motion in one axial direction, or it may also be rotated to be moved as illustrated in FIG. 4, so that the uniformization of the processing on the wafer W is further improved, and a deep hole can be efficiently generated.

Figure 7:
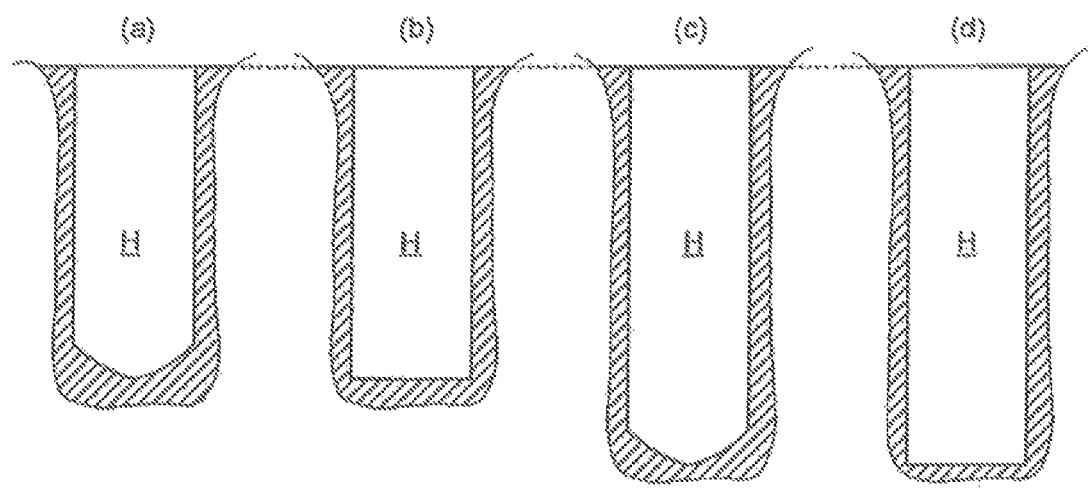
FIG. 7 is a sectional view illustrating one example of performing processing by switching vertical incidence and oblique incidence.

As described above, by using the switches 24b and 24c, the destination of the application of the RF low-frequency voltage can be selected to either the substrate electrode 15 or the introduction electrode 31, and thus it is possible to switch fee vertical incidence and the oblique incidence. For example, the vertically incident ions are used to form a trench or a via hole II on the wafer W (FIG. 7(a)), and thereafter, the obliquely incident ions are used to correct a shape (a shape of a bottom surface, in particular) (FIG. 7(b)). After that, it is possible to repeat the processing of vertical incidence and oblique incidence (FIG. 7(c) and FIG. 7(d)).

Second Embodiment

Figure 8:
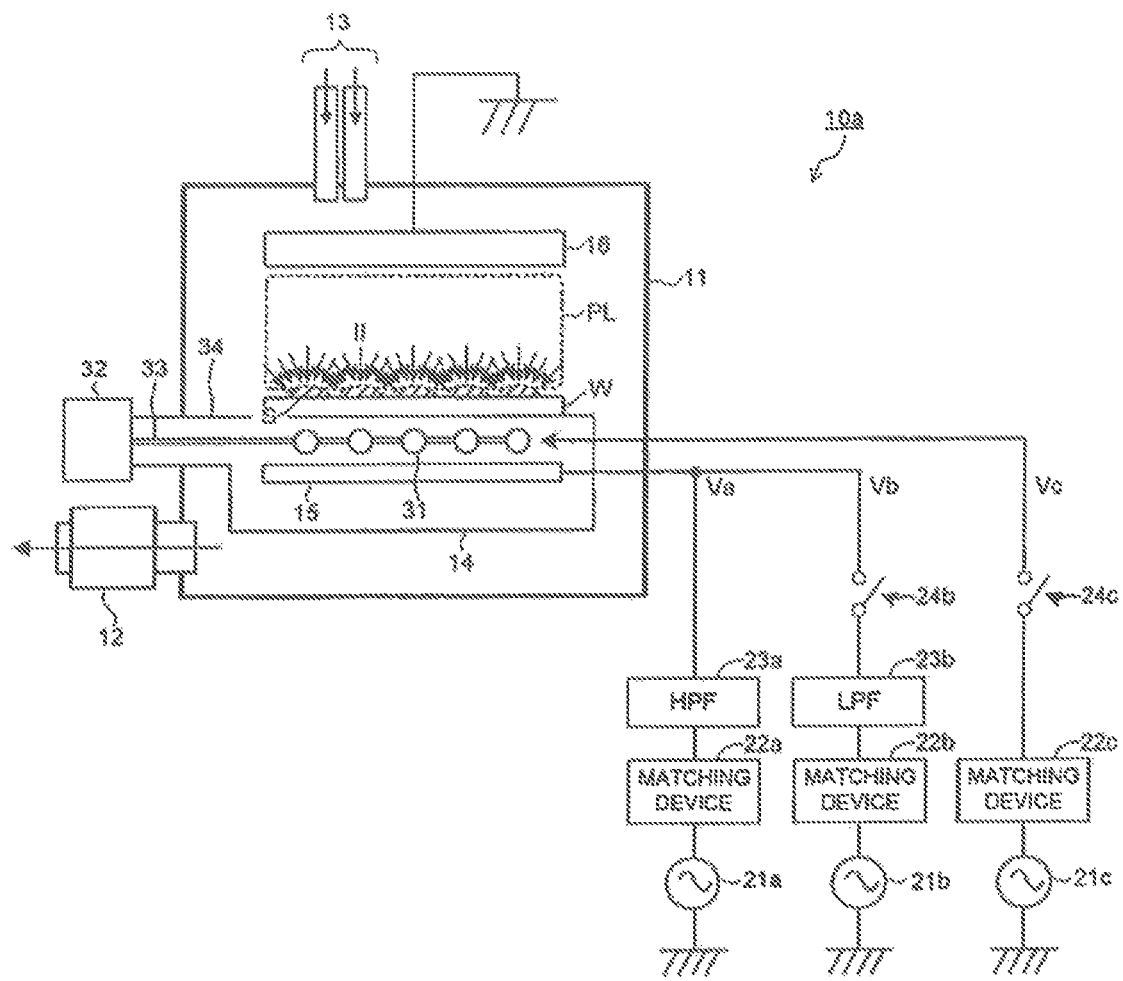
FIG. 8 is a schematic configuration diagram of a plasma processing apparatus 10a according to a second embodiment.

A second embodiment will be described. FIG. 8 is a schematic configuration diagram of a plasma processing apparatus 10a according to the second embodiment.

The plasma processing apparatus 10a has the chamber 11, the exhaust port 12, the process gas introduction pipe 13, the susceptor 14, the substrate electrode 15, the counter electrode 16, the RF high-frequency power source 21a, the RF low-frequency power sources 21b and 21c, the matching devices 22a to 22c, the filters 23a and 23b, the switches 24b and 24c, the introduction electrodes 31, the moving mechanism 32, the connection part 33, and the retreat part 34.

The plasma processing apparatus 10a has a plurality of the Introduction electrodes (introduction electrode group) 31. These plurality of introduction electrodes 31 are disposed by being arranged side by side on an opposite side of the plasma PL with the wafer W sandwiched therebetween. Here, a shape and a size of each of the plurality of introduction electrodes 31 are substantially the same, but, the electrodes may also have different shapes and/or different sizes from one another.

The RF low-frequency voltage Vc Is applied irons the RF low-frequency power source 21c to these plurality of introduction electrodes 31. By using the plurality of introduction electrodes 31, it is possible to reduce a period of time of sweeping the entire surface of the wafer W, when compared to a case where a single introduction electrode 31 is used. The plurality of introduction electrodes 31 are disposed at predetermined intervals. This interval corresponds to a space between the introduction electrodes 31. This interval is preferably about the same as a thickness of the sheath S, namely, 2 mm to 5 mm, which is about the same as a width of the introduction electrode 31. By adjusting the interval between the introduction electrodes 31, the distribution of oblique components of the ions II can be changed.

A range of movement of the introduction electrode 31 is preferably a half or an integral multiple of the interval between the introduction electrodes 31. By designing as above, it Is possible to equalize the periods of time or the number of times during/by which singular points right above the respective introduction electrodes 31 pass through respective points on the wafer W, thereby improving the in-plane uniformity of the water W. For example, it is assumed that 11 pieces of columnar-shaped introduction electrodes 31 are used. At this time, a width of a range covered by each introduction electrode 31 is 300 mm/(11−1)=30 mm. If each introduction electrode 31 is moved at a speed of 30 mm/s by a distance of 15 mm, being a half die range of the coverage, it is possible to perform processing on the range covered by each introduction electrode 31. This requires a processing time, which is 1/10 of a processing time when using one piece of introduction electrode 31. At this time, all of the introduction electrodes 31 can make the same movement in parallel with the wafer W. However, ail of the introduction electrodes 31 do not always have to make the same movement.

It is also possible to apply a direct-current voltage, instead of the high-frequency voltage, to the introduction electrodes 31. The intensity becomes small to some degree, but, the obliquely incident ions II are generated. There is no need to apply the same voltage to all of the introduction electrodes 31. For example, every other introduction electrode 31 can be set to a ground potential. Consequently, it is possible to adjust the electric field components in the direction parallel to the wafer W. It is also possible to cause not only the movement of the introduction electrodes 31 but also the change in the applied voltage.

All of or a part of the introduction electrodes 31 can be moved at the same time. Further, it is also possible to move ail of the introduction electrodes 31 separately.

Further, when the introduction electrodes 31 are moved in the up and down directions, it is also possible to change the distance with the wafer W, for each of the introduction electrodes 31.

Third Embodiment

Figure 9:
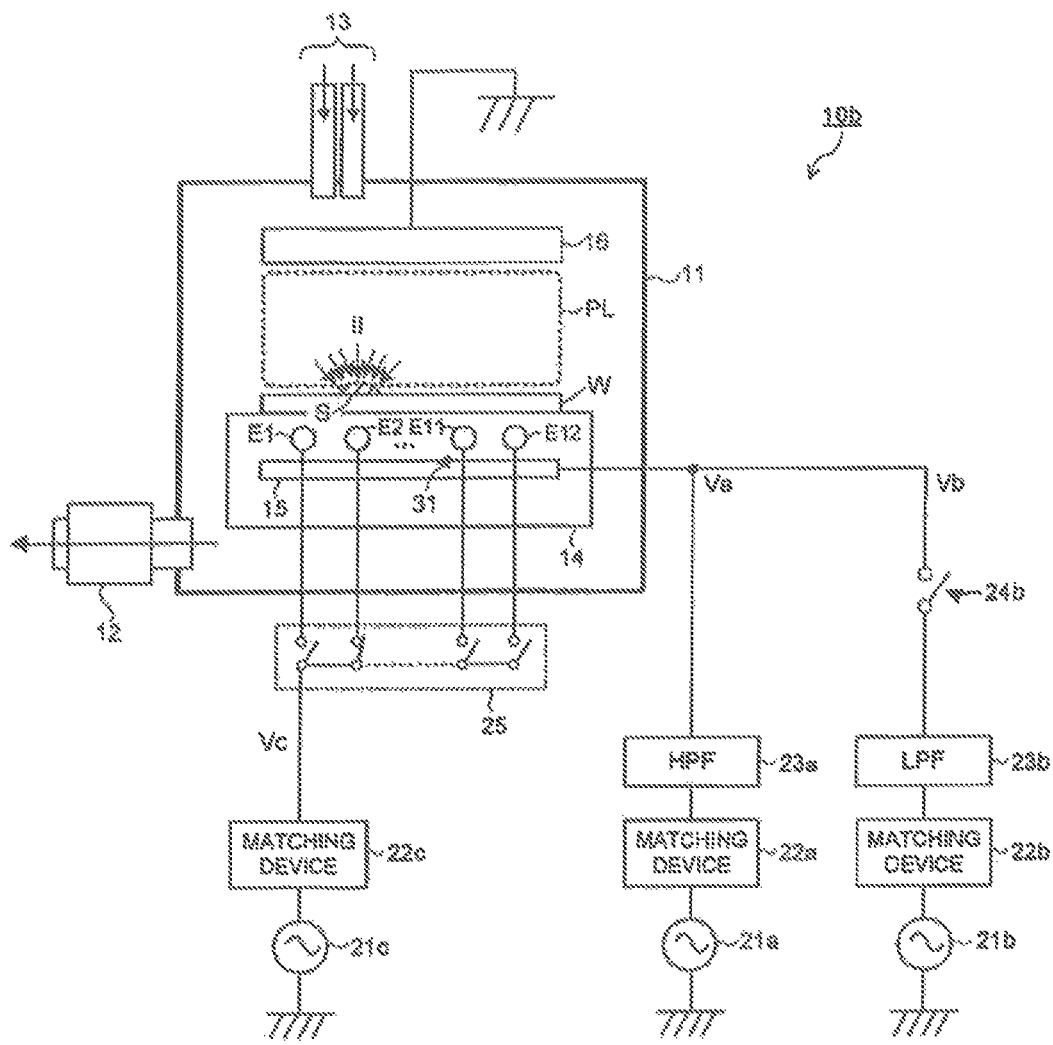
FIG. 9 is a schematic configuration diagram of a plasma processing apparatus 10b according to a third embodiment.

A third embodiment will be described. FIG. 9 is a schematic configuration diagram of a plasma processing apparatus 10b according to the third embodiment.

The plasma processing apparatus 10b has the chamber 11, the exhaust port 12, the process gas introduction pipe 13, the susceptor 14, the substrate electrode 15, the counter electrode 16, the RF high-frequency power source 21a, the RF low-frequency power sources 21b and 21c, the matching devices 22a to 22c, the filters 23a and 23b, the switch 24b, a switching mechanism 25, the introduction electrodes 3), the moving mechanism 32, the connection part 33, and the retreat part 34.

The plasma processing apparatus 10b has a plurality of the introduction electrodes (introduction electrode group) 31. To the introduction electrodes 31, the RF low-frequency voltage Vc is applied from the RF low-frequency power source 21c via the switching mechanism 25. By the switching mechanism 25 (by switching a plurality of switches), it is possible to select the introduction electrode 31 to which the RF low-frequency voltage Vc is applied.

Specifically, by switching the introduction electrode 31 to which the RF low-frequency voltage Vc is applied, without mechanically moving the introduction electrode 31, it is possible to move the sheath S. Here, electrode numbers E1 to E12 are sequentially given to 12 pieces of introduction electrodes 31. Here, it is set that the electrode with an electrode number Ei (i is an integer of 1 to 12) is turned on, and the other electrodes are turned off. By sequentially changing the number i from 1 to 12, the electrode to which the RF low-frequency voltage Vc is applied, is changed. As a result of this, it is possible to move the sheath S and the electric field. Specifically, it is possible to make the oblique components of the electric field sweep with respect to the wafer W, in a similar manner to the ease where the introduction electrode 31 is mechanically moved.

FIG. 10 is a sequence diagram illustrating a state where the RF low-frequency voltage Vc is sequentially applied to the introduction electrodes 31 with the electrode numbers E1 to E12. A period of time of switching the electrode number Ei (a continuation time of applying the voltage to the electrode with the electrode number Ei) is, for example, 1 second. The switching time may also be shorter than 1 second. The switching of the introduction electrodes 31 with the electrode numbers E1 to E12 may also be repeatedly performed a plurality of times. Further, it is also possible to design such that after the switching of the electrodes with the electrode numbers E1 to E12 is conducted, the switching of the electrodes is performed in the opposite order from the electrode numbers E12 to E1, thereby reciprocating the switching operation.

As illustrated in FIG. 11, it is also possible that the introduction electrodes 31 are not completely switched, but, there is provided a period of time of applying the voltage to the plurality of introduction electrodes 31 in an overlapped manner. In a time period T, the voltage is applied to the plurality of introduction electrodes 31.

Figure 12:
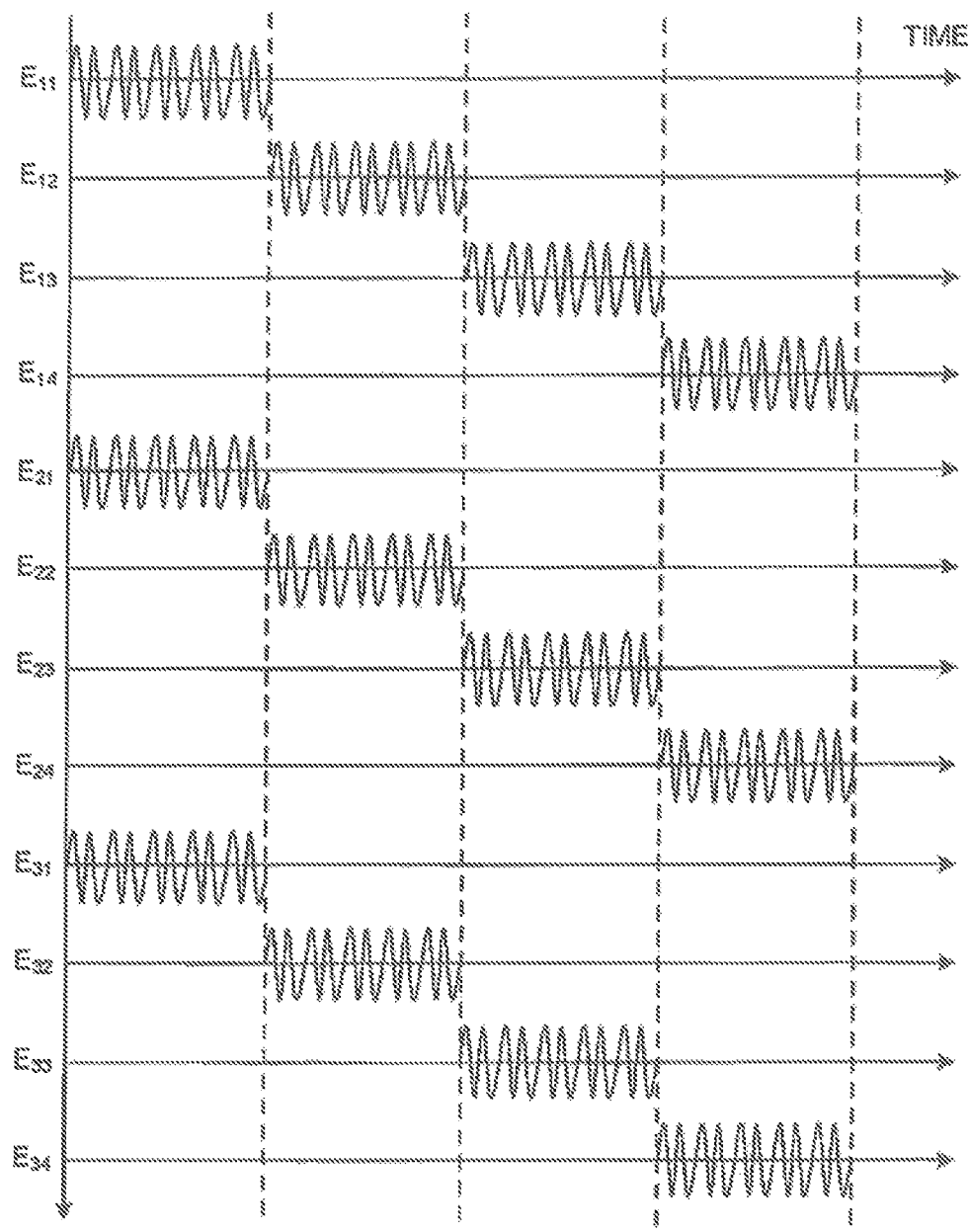
FIG. 12 is a timing chart illustrating one example of voltage waveforms applied to the introduction electrodes 31.

It is also possible to design such that the introduction electrodes 31 are divided into several groups, and the RF low-frequency voltage Vc is sequentially applied within the groups. For example, as illustrated in FIG. 12, 12 pieces of introduction electrodes 31 are set to form 3 groups each including 4 electrodes, to be divided into the electrodes with electrode numbers E11 to E14, electrode numbers E21 to E24, and electrode numbers E31 to E34, and the voltage is sequentially applied for each group.

Here, substantially the same voltage is applied to all of the introduction electrodes 31, but, a part or all of the applied voltages may also be different. Further, a part of the introduction electrodes 31 may also be set to the ground potential.

Fourth Embodiment

Figure 13:
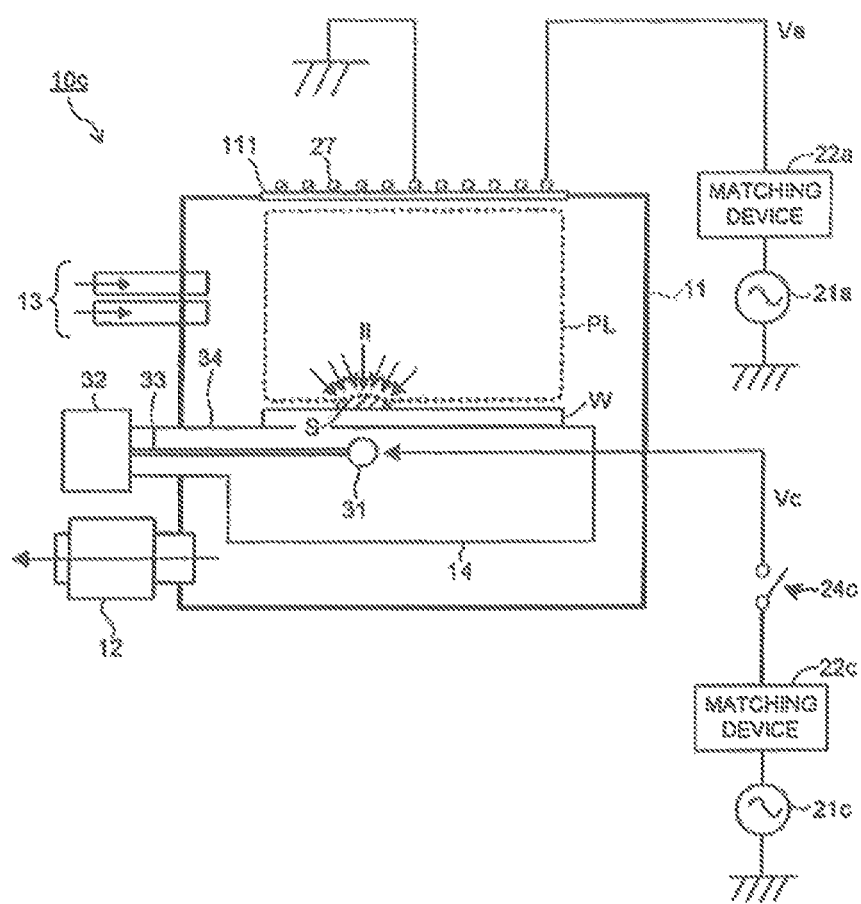
FIG. 13 is a schematic configuration diagram of a plasma processing apparatus 10c according to a fourth embodiment.

FIG. 13 is a schematic configuration diagram of a plasma processing apparatus 10c according to a fourth embodiment. The plasma processing apparatus 10c has the chamber 11, the exhaust port 12, the process gas introduction pipe 13, the susceptor 14, the RF high-frequency power source 21a, the RF low-frequency power source 21c, the matching devices 22a and 22c, the switch 24c, a window 111, an induction coil 27, the introduction electrode 31, the moving mechanism 32, the connection part 33, and the retreat part 34.

The plasma processing apparatus 10c is different from the plasma processing apparatus 10. In that it does not have the substrate electrode 15 and the counter electrode 16 but has the window 111 and the induction coil 27. The window 111 isolates the inside of the chamber 11 from the atmosphere, and a magnetic field from the induction coil 27 is passed through the window 111. As the window 111, a plate of nonmagnetic material such as quartz, for example, is used. The induction coil 27 is disposed on the outside of the chamber 11, When the high-frequency voltage from the RF high-frequency power source 21a is applied to the induction coil 27, a varying magnetic field is generated, resulting in that the process gas in the chamber 11 is ionized, and the plasma PL is generated. Note that a wall surface of the chamber 11 is grounded.

The fourth embodiment is not largely different from the first embodiment in the other points, so that the other explanation thereof will be omitted. The number, the shape, and the way of moving regarding the introduction electrode 31 can be considered in a similar manner to the first to third embodiments.

Examples

Figure 14:
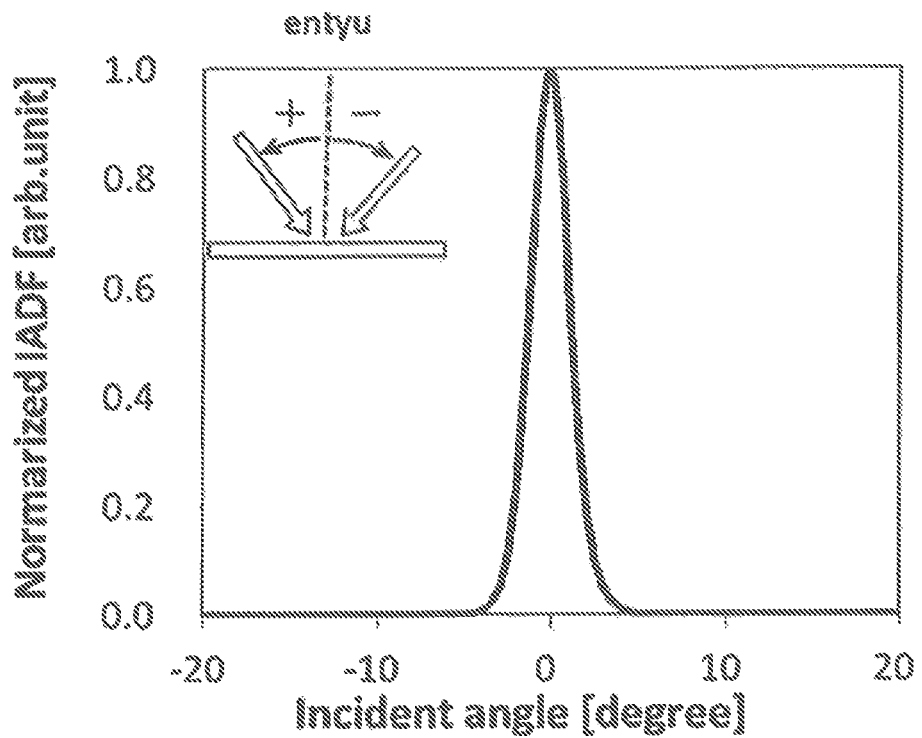
FIG. 14 is a graph illustrating an incident angle distribution of ions.

The oblique incidence of ions II in the plasma processing apparatus 10 was checked through plasma simulation, A state of the oblique incidence of ions is represented by an ion incident angle distribution (IADF) illustrated in FIG. 14. The IADF represents a relationship between an incident angle of ions which are incident on a certain position on the wafer W and a distribution of the ions (relative amount). Here, the incidence on the right side and the incidence on the left side are represented as a positive angle and a negative angle, respectively.

Figure 15:
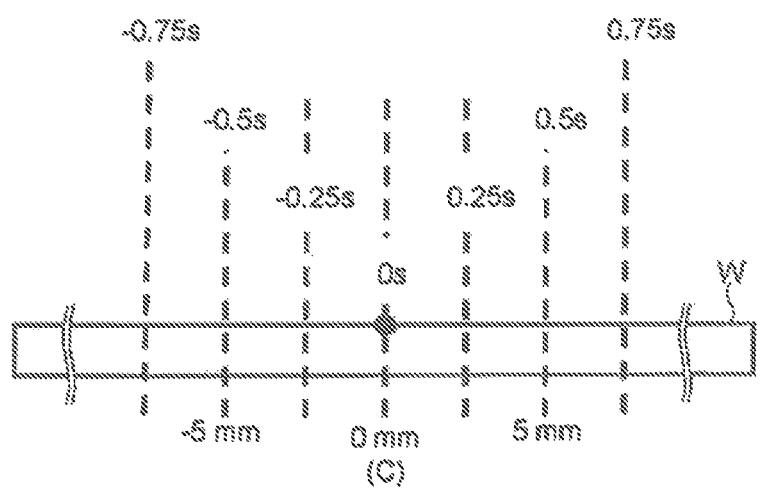
FIG. 15 is a schematic diagram illustrating a relationship between a position of the introduction electrode 31 on the wafer W and a period of time.

FIG. 15 is a schematic diagram representing a relationship between a position of the introduction electrode 31 on the wafer W and a period of time. The introduction electrode 31 in a columnar shape with a diameter of 2 mm was used. A moving speed of the introduction electrode 31 is set to 10 mm/s in the left direction (a speed at which the electrode Is moved from one edge to the other edge of the wafer W at 30 seconds). At this time, the introduction electrode 31 moves by 2.5 mm at a speed of 0.25 seconds.

Figure 16:
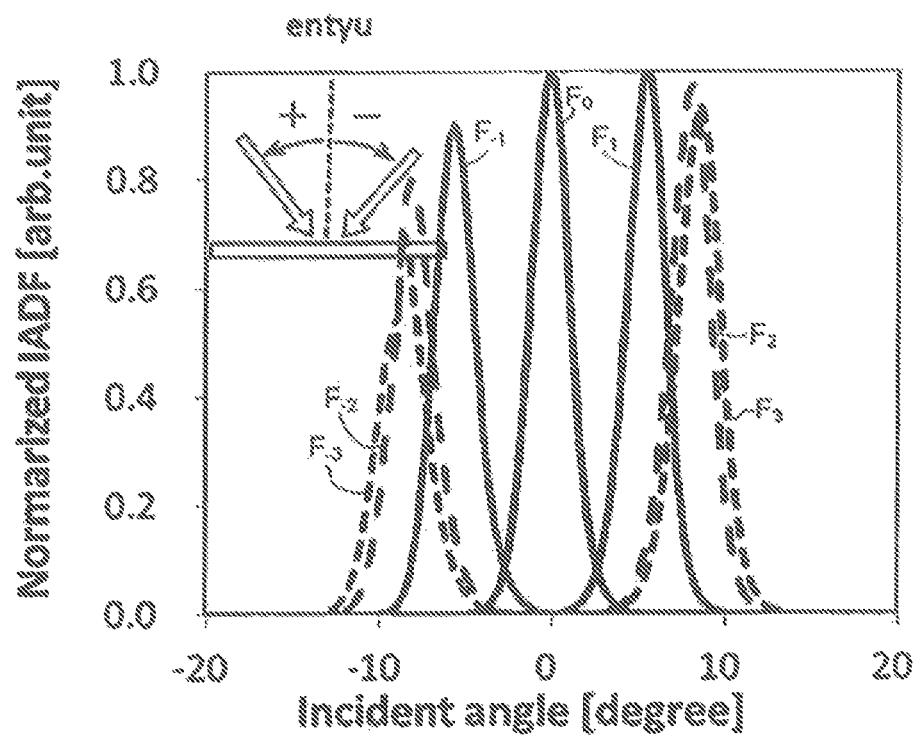
FIG. 16 is a graph illustrating an incident angle distribution of ions at each point of time.

As Illustrated in FIG. 15, a center (C) of the wafer W is set to an evaluation point P, and a point of time t at which the introduction electrode 31 passes through the evaluation point P, is set to a reference point of time (0 seconds). At this time, the IADFs at evaluation points when the points of time t are −0.75 seconds, −0.5 seconds, −0.25 seconds, 0 seconds, 0.25 seconds, 0.5 seconds, and 0.75 seconds are represented as graphs $F_{-3}$ to $F_3$, respectively, in FIG. 16.

Figure 17:
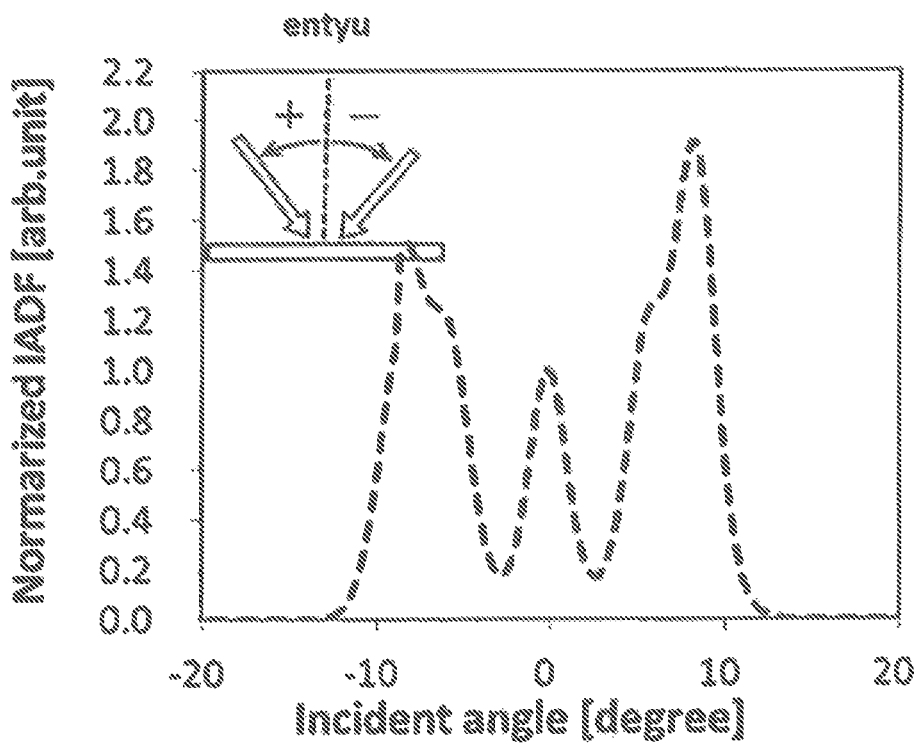
FIG. 17 is a graph illustrating an incident angle distribution of ions as a whole.

The introduction electrode 31 passes through the evaluation point F from the point of time of −0.75 seconds to the point of time of +0.75 seconds. A sum (total sum) of the IADFs at the respective points of time at this time corresponds to a total IADF at the evaluation point P (refer to FIG. 17). The total IADF has peaks with about, the same intensity on the right and left sides, respectively. The two peaks correspond to oblique incidence from the left side and oblique incidence from the right side, respectively. Note that although there is a slight difference between the left and right peaks, this is a kind of error. In a uniform process, a symmetric distribution is normally obtained. A weak peak positioned at 0 degree is obtained by vertically incident components due to a singular point, and can be relatively reduced by making the introduction electrode 31 repeatedly pass through the evaluation point P.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A plasma processing apparatus, comprising:
a chamber;
an introducing part that introduces gas into the chamber;
a substrate electrode in the chamber, the substrate electrode having a plate shape;
a counter electrode in the chamber;
a holder that holds a substrate between the substrate electrode and the counter electrode;
an introduction electrode between the substrate electrode and the substrate, the introduction electrode having a surface not parallel to the substrate;
a first power source that applies a first voltage to the substrate electrode to generate ions from the gas;
a second power source that applies a second voltage to the introduction electrode, the second voltage having a frequency lower than the frequency of the first voltage and introducing the ions to the substrate; and
a third power source that applies a third voltage to the substrate electrode, the third voltage having a frequency lower than the frequency of the first voltage, wherein
the plasma processing apparatus is configured to switch between a first state where the third power source applies the third voltage to the substrate electrode, and a second state where the second power source applies the second voltage to the introduction electrode,
the first power source applies the first voltage to the substrate electrode during both of the first state and the second state, and
the first, second and third power sources are configured so that the third power source is electrically connected with the first power source in the first state, and the second power source is not electrically connected with the first and third power sources in the first and second states.

2. The plasma processing apparatus of claim 1, wherein the introduction electrode has a bar shape.

3. The plasma processing apparatus of claim 2, wherein the introduction electrode has a width of 0.5 mm or more, and a length larger than a diameter of the substrate.

4. The plasma processing apparatus of claim 1, wherein the introduction electrode has a circular shape from a viewpoint above the substrate.

5. The plasma processing apparatus of claim 1, further comprising a moving mechanism that moves introduction the electrode along a surface of the substrate.

6. The plasma processing apparatus of claim 5, wherein the moving mechanism moves the introduction electrode linearly or reciprocatively.

7. The plasma processing apparatus of claim 5,
wherein the moving mechanism moves the introduction electrode to be contacted with or away from the substrate electrode.

8. The plasma processing apparatus of claim 1, further comprising a second introduction electrode between the substrate electrode and the substrate and side by side with the introduction electrode, and to which the second voltage is applied.

9. The plasma processing apparatus of claim 8,
wherein a shape and a size of the introduction electrode and the second introduction electrode are substantially the same.

10. The plasma processing apparatus of claim 8,
wherein an interval between the introduction electrode and the second introduction electrode is 5 mm or less.

11. The plasma processing apparatus of claim 8,
wherein the second voltage is alternately applied to the introduction electrode and the second introduction electrode.

12. The plasma processing apparatus of claim 11,
wherein the second voltage applied to the introduction electrode and the second voltage applied to the second introduction electrode are different.

13. The plasma processing apparatus of claim 12,
wherein the second introduction electrode has a ground potential.

14. The plasma processing apparatus of claim 1, further comprising a switch that select either of the substrate electrode and the introduction electrode, and applies the second voltage to the selected electrode.

15. The plasma processing apparatus of claim 1,
wherein the first power source is electrically connected to a signal line electrically connected to the substrate electrode and is disconnected to the introduction electrode, the second power source is disconnected to the substrate electrode and is electrically connected to the introduction electrode, and the third power source is electrically connected to the signal line electrically connected to the substrate electrode via a switch and is disconnected to the introduction electrode.

* * * * *